(12) United States Patent
Jeon et al.

(10) Patent No.: US 11,777,524 B2
(45) Date of Patent: Oct. 3, 2023

(54) METHOD FOR SUPPORTING RATE-COMPATIBLE NON-BINARY LDPC CODE, AND WIRELESS TERMINAL USING SAME

(71) Applicant: LG Electronics Inc., Seoul (KR)

(72) Inventors: Kijun Jeon, Seoul (KR); Sangrim Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 35 days.

(21) Appl. No.: 17/605,850

(22) PCT Filed: Apr. 22, 2019

(86) PCT No.: PCT/KR2019/004805
§ 371 (c)(1),
(2) Date: Oct. 22, 2021

(87) PCT Pub. No.: WO2020/218629
PCT Pub. Date: Oct. 29, 2020

(65) Prior Publication Data
US 2022/0224355 A1    Jul. 14, 2022

(51) Int. Cl.
*H03M 13/00* (2006.01)
*H03M 13/11* (2006.01)
*H04L 1/00* (2006.01)

(52) U.S. Cl.
CPC ...... *H03M 13/1148* (2013.01); *H03M 13/611* (2013.01); *H04L 1/0057* (2013.01)

(58) Field of Classification Search
CPC ........... H03M 13/1148; H03M 13/611; H03M 13/6393; H03M 13/1171; H04L 1/0057; H04L 1/0068
See application file for complete search history.

(56) References Cited

U.S. PATENT DOCUMENTS

| | | | | |
|---|---|---|---|---|
| 7,895,500 B2 * | 2/2011 | Sun | ......................... | H04L 1/005 |
| | | | | 714/752 |
| 8,689,083 B2 * | 4/2014 | Nguyen | ............. | H03M 13/1197 |
| | | | | 714/781 |
| 10,355,822 B2 * | 7/2019 | Patel | ...................... | H04L 1/0041 |
| 10,454,499 B2 * | 10/2019 | Richardson | .......... | H03M 13/616 |
| 10,469,104 B2 * | 11/2019 | Kudekar | .............. | H03M 13/616 |
| 10,784,901 B2 * | 9/2020 | Kudekar | ................ | H04L 1/0041 |
| 11,043,966 B2 * | 6/2021 | Richardson | .......... | H03M 13/036 |
| 2011/0307756 A1 | 12/2011 | Nguyen et al. | | |
| 2012/0131409 A1 | 5/2012 | Divsalar et al. | | |
| 2017/0317694 A1 * | 11/2017 | Lee | ...................... | H03M 13/116 |
| 2019/0013827 A1 | 1/2019 | Richardson | | |

FOREIGN PATENT DOCUMENTS

WO    WO2019068053    4/2019

* cited by examiner

*Primary Examiner* — Esaw T Abraham
(74) *Attorney, Agent, or Firm* — Fish & Richardson P.C

(57) ABSTRACT

A method for supporting a rate-compatible non-binary LDPC code, performed by a wireless device, according to the present embodiment, comprises the steps of: acquiring a kernel part comprising a plurality of first check nodes and a plurality of first variable nodes, the kernel part having a predetermined first code rate applied thereto, and the level of each of the plurality of first variable nodes included in the kernel part being set to 2; and generating, on the basis of the kernel part, a protograph having a second code rate, when a change from the first code rate to the second code rate is required.

10 Claims, 15 Drawing Sheets

FIG. 3

$$H_p = \begin{bmatrix} 3 & 2 & 0 \\ 2 & 1 & 2 \end{bmatrix}$$

FIG. 4

$$H_a = \begin{bmatrix} 1 & 1 & 1 & 1 & 0 & 1 & 0 & 0 & 0 \\ 1 & 1 & 1 & 1 & 1 & 0 & 0 & 0 & 0 \\ 1 & 1 & 1 & 0 & 1 & 1 & 0 & 0 & 0 \\ 0 & 1 & 1 & 1 & 0 & 0 & 1 & 0 & 1 \\ 1 & 0 & 1 & 0 & 1 & 0 & 0 & 1 & 1 \\ 1 & 1 & 0 & 0 & 0 & 1 & 1 & 1 & 0 \end{bmatrix}$$

FIG. 5

$$H = \begin{bmatrix} s_{1,1} & s_{1,2} & s_{1,3} & s_{1,4} & -1 & s_{1,6} & -1 & -1 & -1 \\ s_{2,1} & s_{2,2} & s_{2,3} & s_{2,4} & s_{2,5} & -1 & -1 & -1 & -1 \\ s_{3,1} & s_{3,2} & s_{3,3} & -1 & s_{3,5} & s_{3,6} & -1 & -1 & -1 \\ -1 & s_{4,2} & s_{4,3} & s_{4,4} & -1 & -1 & s_{4,7} & -1 & s_{4,9} \\ s_{5,1} & -1 & s_{5,3} & -1 & s_{5,5} & -1 & -1 & s_{5,8} & s_{5,9} \\ s_{6,1} & s_{6,2} & -1 & -1 & -1 & s_{6,6} & s_{6,7} & s_{6,8} & -1 \end{bmatrix}$$

METHOD FOR SUPPORTING RATE-COMPATIBLE NON-BINARY LDPC CODE, AND WIRELESS TERMINAL USING SAME

CROSS-REFERENCE TO RELATED APPLICATIONS

This application is a National Stage application under 35 U.S.C. § 371 of International Application No. PCT/KR2019/004805, filed on Apr. 22, 2019. The disclosure of the prior application is incorporated by reference in its entirety.

BACKGROUND OF THE DISCLOSURE

Field of the Disclosure

The present disclosure relates to wireless communication, and more specifically, to a method for supporting rate-compatible nonbinary low density parity check (LDPC) code and a wireless terminal using the same Related Art Conventional LDPC encoding methods are used in wireless communication systems such as IEEE 802.11n WLAN, IEEE 802.16e mobile WiMAX, and Digital Video Broadcasting-Satellite-Second Generation (DVBS2). Since an LDPC encoding method is basically a type of linear block code, the operation of the LDPC encoding method is composed of a product of a parity check matrix and an input vector.

A kernel part design is important in construction of a rate-compatible structure. In general, a method of determining a partial part having a highest code rate as a kernel part and extending it to a low code rate ensures waterfall performance at the overall rate.

In a use case of super URLLC (Ultra-Reliable and Low-Latency Communication), the structure of a protograph for a rate-compatible NB-LDPC code provides a high potential to channel code in a short packet regime.

SUMMARY

An object of the present disclosure is to provide a method for supporting a rate-compatible non-binary LDPC code having improved performance and a wireless terminal using the same.

A method for supporting a rate-compatible non-binary LDPC code performed by a wireless device according to an embodiment of the present disclosure includes obtaining a kernel part including a plurality of first check nodes and a plurality of first variable nodes, wherein a predetermined first code rate is applied to the kernel part, and a degree of each of the plurality of first variable nodes included in the kernel part is set to '2', and generating a protograph having a second code rate based on the kernel part when a change from the first code rate to the second code rate is requested.

ADVANTAGEOUS EFFECTS

According to an embodiment of the present disclosure, a method for supporting a rate-compatible non-binary LDPC code having improved performance and a wireless terminal using the same are provided.

BRIEF DESCRIPTION OF THE DRAWINGS

FIG. 3 is a diagram showing a matrix associated with a protograph.

FIG. 4 is a diagram showing a basegraph associated with a protograph.

FIG. 5 is a diagram showing a parity check matrix associated with a protograph.

DESCRIPTION OF EXEMPLARY EMBODIMENTS

The foregoing characteristics and the following detailed description are all exemplary matters for aiding in description and understanding of the present disclosure. That is, the present disclosure is not limited to such an embodiment and may be embodied in other forms. The following embodiments are merely examples for fully disclosing the present disclosure and are descriptions for conveying the present disclosure to those skilled in the art to which the present disclosure pertains. Therefore, when there are several methods for implementing the elements of the present disclosure, it is necessary to make it clear that the implementation of the present disclosure is possible in any one of these methods or an equivalent thereto.

When it is stated in the present disclosure that a certain configuration includes specific elements or a certain process includes specific steps, it means that other elements or other steps may be further included. That is, terms used in the present disclosure are only for describing specific embodiments and are not intended to limit the concept of the present disclosure. Furthermore, examples described to aid in understanding of the disclosure also include complementary embodiments thereof.

Terms used in the present disclosure have meanings commonly understood by those of ordinary skill in the art to which the present disclosure pertains. Commonly used terms should be interpreted in a consistent sense according to the context of the present disclosure. In addition, terms used herein should not be construed in an overly idealistic or formal meaning unless the meanings are clearly defined. Hereinafter, embodiments of the present disclosure will be described with reference to the accompanying drawings.

Figure 1:
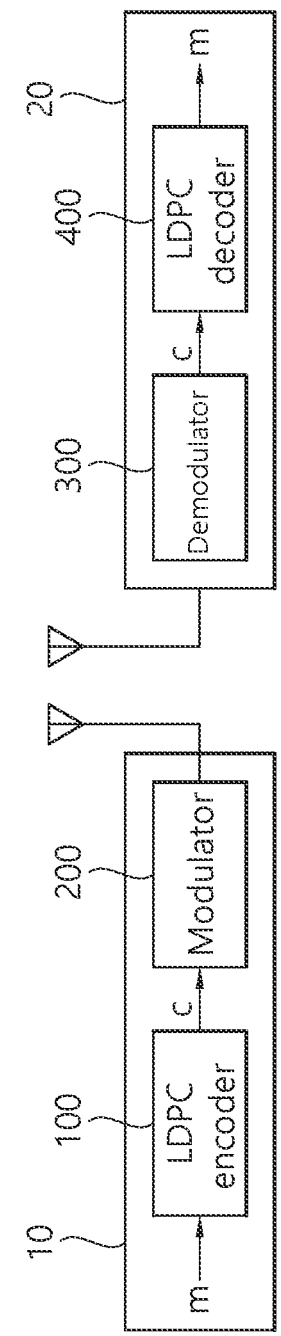
FIG. 1 is a block diagram showing a wireless communication system according to the present embodiment.

FIG. 1 is a block diagram showing a wireless communication system according to the present embodiment.

Referring to FIG. 1, the wireless communication system may include a transmitting terminal 10 and a receiving terminal 20.

The transmitting terminal 10 may include an LDPC encoder 100 and a modulator 200. The LDPC encoder 100 may receive data m, encode the received data m, and output a codeword c. The modulator 200 may receive the codeword c and wirelessly modulate the received codeword c. The wirelessly modulated codeword may be transmitted to the receiving terminal 20 through an antenna.

A processor (not shown) of the transmitting terminal 10 includes the LDPC encoder 100 and the modulator 200 and may be understood as being connected to the antenna of the transmitting terminal 10.

The receiving terminal 20 may include a demodulator 300 and an LDPC decoder 400. The demodulator 300 may receive the wirelessly modulated codeword through an antenna and demodulate the same into the codeword c. The LDPC decoder 400 may receive the codeword c, decode the received codeword c, and output the data m.

A processor (not shown) of the receiving terminal 20 includes the demodulator 300 and the LDPC decoder 400 and may be understood as being connected to an antenna of the receiving terminal 20.

In other words, the wireless communication system of FIG. 1 may encode the data m into the codeword c using the LDPC encoder 100 and decode the codeword c into the data m using the LDPC decoder 400.

Accordingly, the data m may be stably transmitted/received between the transmitting terminal 10 and the receiving terminal 20. The LDPC encoding method and decoding method according to the present disclosure may be performed based on a parity check matrix H.

In the present disclosure, the data m may be referred to as input data. The parity check matrix H may refer to a matrix for checking whether an error is included in the codeword c received by the LDPC decoder 400. The parity check matrix H may be prestored in a memory (not shown) of each of the transmitting terminal 10 and the receiving terminal 20.

Hereinafter, an embodiment of the present disclosure will be described on the assumption that a quasi-cyclic LDPC code is applied. The parity check matrix H may include a plurality of sub-matrices P. Each sub-matrix P may be a cyclic matrix in which an identity matrix I is shifted or a zero matrix O.

In order to encode data in a general linear block code, a generator matrix G is required. According to the above assumption, since the present embodiment assumes a quasi-cyclic LDPC method, the LDPC encoder 100 converts the data m into the codeword c using the parity check matrix H without an additional generate matrix G.

The LDPC encoder 100 may encode the data m into the codeword c using the parity check matrix H.

$$c = [m\ p] \qquad \text{[Equation 1]}$$

Referring to Equation 1, the codeword c generated by the LDPC encoder 100 may be divided into the data (m) and a parity bit p.

For example, the data m may correspond to a set of binary data, $[m\_0, m\_1, m\_2, \ldots, m\_K{-}1]$. That is, the length of the data m to be encoded may be understood as K.

For example, the parity bit p may correspond to a set of binary data, $[p\_0, p\_1, p\_2, \ldots, p\_N{+}2Zc{-}K{-}1]$. That is, the length of the parity bit p may be understood as N+2Zc−K. In this case, N=50Zc. Zc will be described in detail with reference to the drawings described below.

From the perspective of the LDPC encoder 100, a parity bit p for encoding the data m may be derived using the parity check matrix H.

Additionally, it may be assumed that initial data of a transport block size (hereinafter "TBS") exceeding a preset threshold size (i.e., Kcb, for example, 8448 bits) is received from an upper layer on a channel coding chain.

In this case, the initial data may be divided into at least two pieces of data according to the length (K, K being a natural number) of the data to be encoded. In other words, the length K of the data m may be understood as a code block size (CBS).

It will be understood that the matrix H according to the present disclosure is applied when the code block size (CBS) does not exceed a predetermined threshold value (e.g., 2040 bits).

Meanwhile, the LDPC decoder 400 may determine presence or absence of an error in the received codeword c based on the parity check matrix H. Presence or absence of an error in the codeword c received by the LDPC decoder 400 may be checked based on Equation (2).

$$H \bullet c^T = 0 \qquad \text{[Equation 2]}$$

As represented by Equation 2, when the product of the parity check matrix H and the transpose matrix of the codeword c is "0", it may be determined that the codeword c received by the receiving terminal 20 does not include an error value.

If the product of the parity check matrix H and the transpose matrix of the codeword c is not "0", it may be determined that the codeword c received by the receiving terminal 20 includes an error value.

Figure 2:
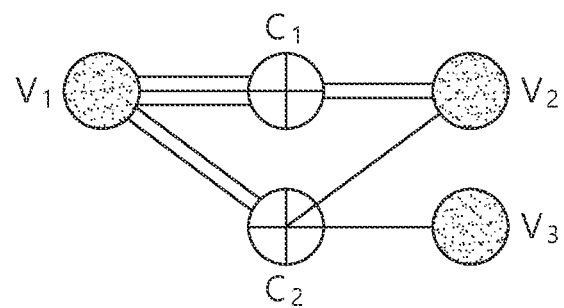
FIG. 2 is a diagram showing a protograph.

FIG. 2 is a diagram showing a protograph

Referring to FIG. 2, a protograph may be composed of a plurality of variable nodes (hereinafter "VNs"), a plurality of check nodes (hereinafter "CNs"), and a plurality of edges.

In addition, the protograph may be defined by Equation 3 below.

$$\Pi = (V, \mathcal{C}, \varepsilon) \qquad \text{[Equation 3]}$$

Here, $V(\mathcal{C})$ and $\varepsilon$ denote a VN (CN) set and an edge set constituting the protograph Π. A protograph may be a minimum unit representing a parity check matrix (PCM, hereinafter, H) for an LDPC code.

In general, extension from a protograph to the PCM can be performed in the order of the protograph, a basegraph and the PCM.

Performance prediction of LDPC code and an encoding method may be inferred using a protograph and a mathematical tool (e.g., extrinsic information transfer (EXIT) chart analysis). That is, good design of LDPC code can be regarded as an equivalent problem to good design of a protograph.

Figure 3:
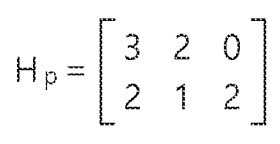

FIG. 3 is a diagram showing a matrix associated with a protograph.

Referring to FIG. 2 and FIG. 3, the rows of a matrix $H_p$ of FIG. 3 may be associated with the check nodes $C_1$ and $C_2$ of FIG. 2 and the columns of the matrix $H_p$ of FIG. 3 may be associated with the variable nodes $V_1$, $V_2$, and $V_3$ of FIG. 2.

For example, the value 3 of the position corresponding to (1,1) in the matrix $H_p$ of FIG. 3 may be associated with the number of edges between the first check node $C_1$ and the first variable node $V_1$. Further, the value 2 of the position corresponding to (1,2) of the matrix $H_p$ of FIG. 3 may be associated with the number of edges between the first check node $C_1$ and the second variable node $V_2$. In addition, the value "0" of the position corresponding to (1,3) of the matrix $H_p$ of FIG. 3 may be associated with the number of edges between the first check node $C_1$ and the third variable node $V_3$.

For example, the value 2 of the position corresponding to (2,1) of the matrix $H_p$ of FIG. 3 may be associated with the number of edges between the second check node $C_2$ and the first variable node $V_1$. Further, the value "1" of the position corresponding to (2,2) of the matrix $H_p$ of FIG. 3 may be associated with the number of edges between the second check node $C_2$ and the second variable node $V_2$. In addition, the value 2 of the position corresponding to (2,3) of the matrix $H_p$ of FIG. 3 may be associated with the number of edges between the second check node $C_2$ and the third variable node $V_3$.

FIG. 4 is a diagram showing a basegraph associated with a protograph.

Referring to FIG. 2 to FIG. 4, the basegraph $H_a$ of FIG. 4 is a matrix extended based on the matrix $H_p$ of FIG. 3. Each 3×3 sub-matrix included in the basegraph $H_a$ of FIG. 4 may be associated with a value of a corresponding position of the matrix HP of FIG. 3.

FIG. 5 is a diagram showing a parity check matrix associated with a protograph.

Referring to FIG. 2 to FIG. 5, when $s_{i,j}$ (where i is a row index and j is a column index) of the parity check matrix H of FIG. 5 is $s_{i,j} \geq 0$, $s_{i,j}$ means a left-cyclic shift value of an identity matrix having a size of Z×Z.

For example, when $s_{i,j}$ is −1, a position corresponding to −1 in the parity check matrix H of FIG. 5 may be associated with an all zero matrix having a size of Z×Z.

The basegraph means a binary matrix, and when there is no parallel edge on the protograph, the protograph and the basegraph may have an equivalent relationship.

Referring to FIG. 2 and FIG. 5, when the protograph of FIG. 2 is extended to the parity check matrix H of FIG. 5, VNs, CNs and edges of FIG. 2 correspond to columns, rows, and '1's in the parity check matrix H of FIG. 5.

In general, LDPC code series is a B-LDPC code, and encoding and/or decoding operations are performed with operations confined in Galois Field 2 (GF(2)). NB-LDPC code is encoded and/or decoded according to operations confined in GF($2^q$) by releasing this limitation.

In general, the NB-LDPC code and the B-LDPC code have advantages and disadvantages as shown in Table 1 below.

TABLE 1

| | Description |
| --- | --- |
| Waterfall performance | NB-LDPC code shows the better waterfall performance than B-LDPC code |
| Minimum distance | NB-LDPC code has the better minimum distance property than B-LDPC code |

TABLE 1-continued

| | Description |
| --- | --- |
| | However, NB-LDPC code also cannot achieve the LMDG property if the protograph does not have the LMDG property |
| BLER performance | NB-LDPC code shows the better BLER performance than B-LDPC code Especially, the performance gap is larger as the codeword length is shorter |
| Encoder complexity | Both codes have the similar complexity |
| Decoder complexity | NB-LDPC code requires higher complexity than B-LDPC code In case of the sum-product algorithm, $O(q\log_2(q))$ is typically required in case of GF($2^q$) |

Referring to Table 1, it shows that the NB-LDPC code has potential in aspects other than decoder complexity as compared to the B-LDPC code. In particular, the advantage of the NB-LDPC code can be maximized in a short codeword length.

In particular, the NB-LDPC code may have an advantage over a polar code in terms of performance even when it uses an iterative decoder over the polar code. Consequently, it can be considered that the NB-LDPC code has great potential to support super URLLC targeting a short packet.

One of the main features of the NB-LDPC code is an iterative decoding threshold. Here, the iterative decoding threshold is associated with waterfall performance.

In the present disclosure, an average variable node degree (hereinafter, "AVND", $d_v^*$) may be significantly considered when a protograph of the NB-LDPC code is designed. For example, $d_v^*$ has the following characteristics according to change in q in GF($2^q$).

For example, when $d_v^*$ is 2, decoding threshold characteristic improves as q increases. For example, when $d_v^*$ is $2 < d_v^* \leq \alpha$, the decoding threshold characteristic improves as q increases, and when q increases above a specific value, the decoding threshold characteristic starts to deteriorate. For example, when $d_v^*$ is $d_v^* > \alpha$, the decoding threshold characteristic deteriorates as q increases. Here, α may be any value between 2 and 3.

Figure 6:
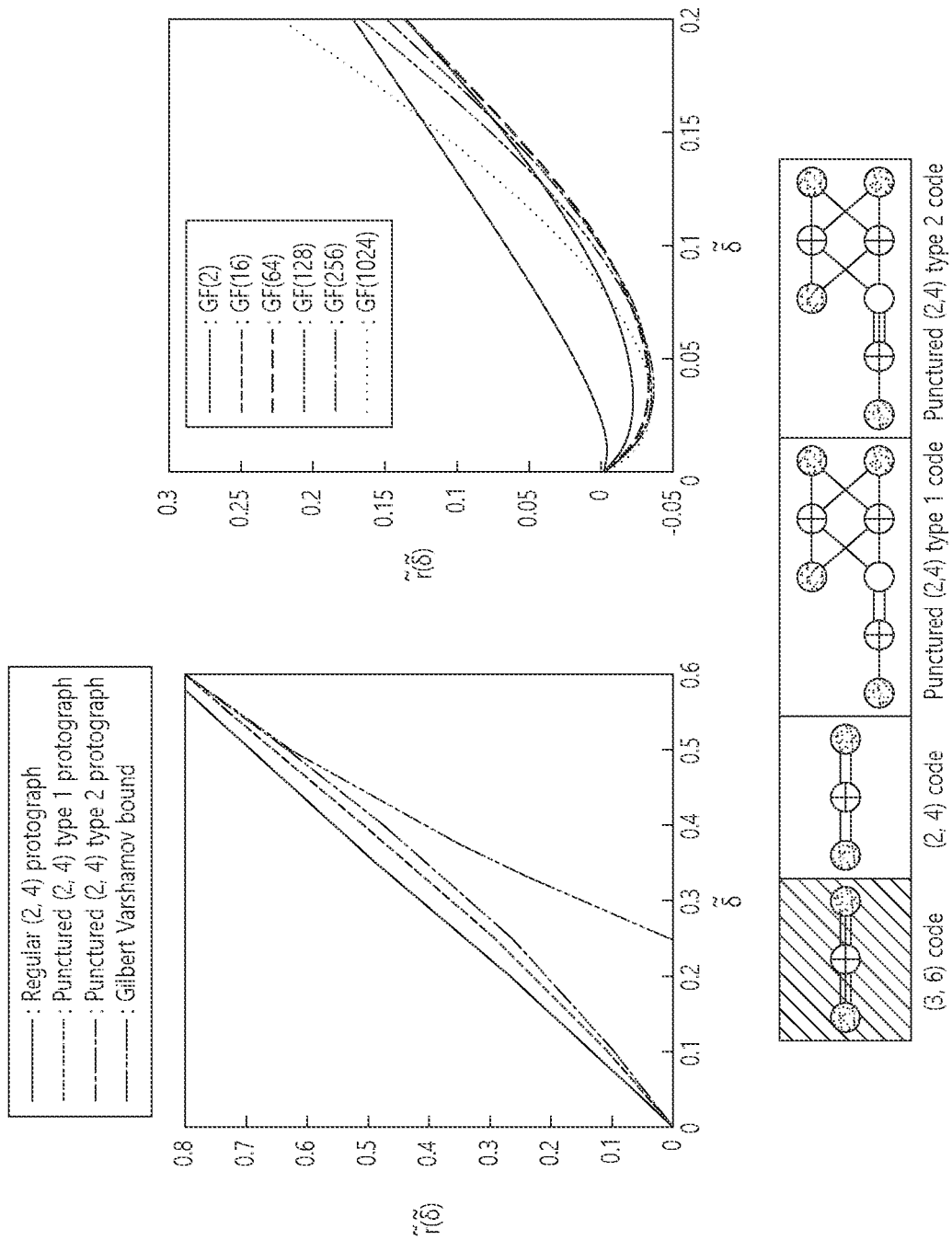
FIG. 6 is a diagram showing simulation results for a minimum distance characteristic which is one of characteristics of a protograph for an NB-LDPC code.

FIG. 6 is a diagram showing simulation results for a minimum distance characteristic, which is one of the characteristics of a protograph for the NB-LDPC code.

One of the factors that determine characteristics associated with an error floor of the LDPC code is the minimum distance characteristic. The minimum distance characteristic of the LDPC code can be inferred through the typical minimum distance analysis of the protograph without verifying the performance of an actual block error rate (BLER).

In the present description, it may be determined whether the protograph has a linear minimum distance growth (LMDG) characteristic through typical minimum distance analysis. Here, the LMDG characteristic refers to a characteristic in which a minimum distance linearly increases as the length of a codeword increases.

That is, it is possible to predict how robust a PCM derived from the protograph is to an error floor through typical minimum distance analysis for the protograph.

In the present disclosure, the LMDG characteristic is determined by the structural characteristic of the protograph instead of whether the nonbinary characteristic is applied to the LDPC code.

However, referring to FIG. 6, in the case of a protograph that satisfies the LMDG characteristic, it can be ascertained that a typical minimum distance (that is, measurement of a minimum distance from an asymptotic viewpoint) is improved as nonbinary characteristics become strong (e.g., q increases).

Referring to FIG. 6, even if the LMDG characteristic is not satisfied, it can be predicted that the minimum distance increases as q increases.

Figure 7:
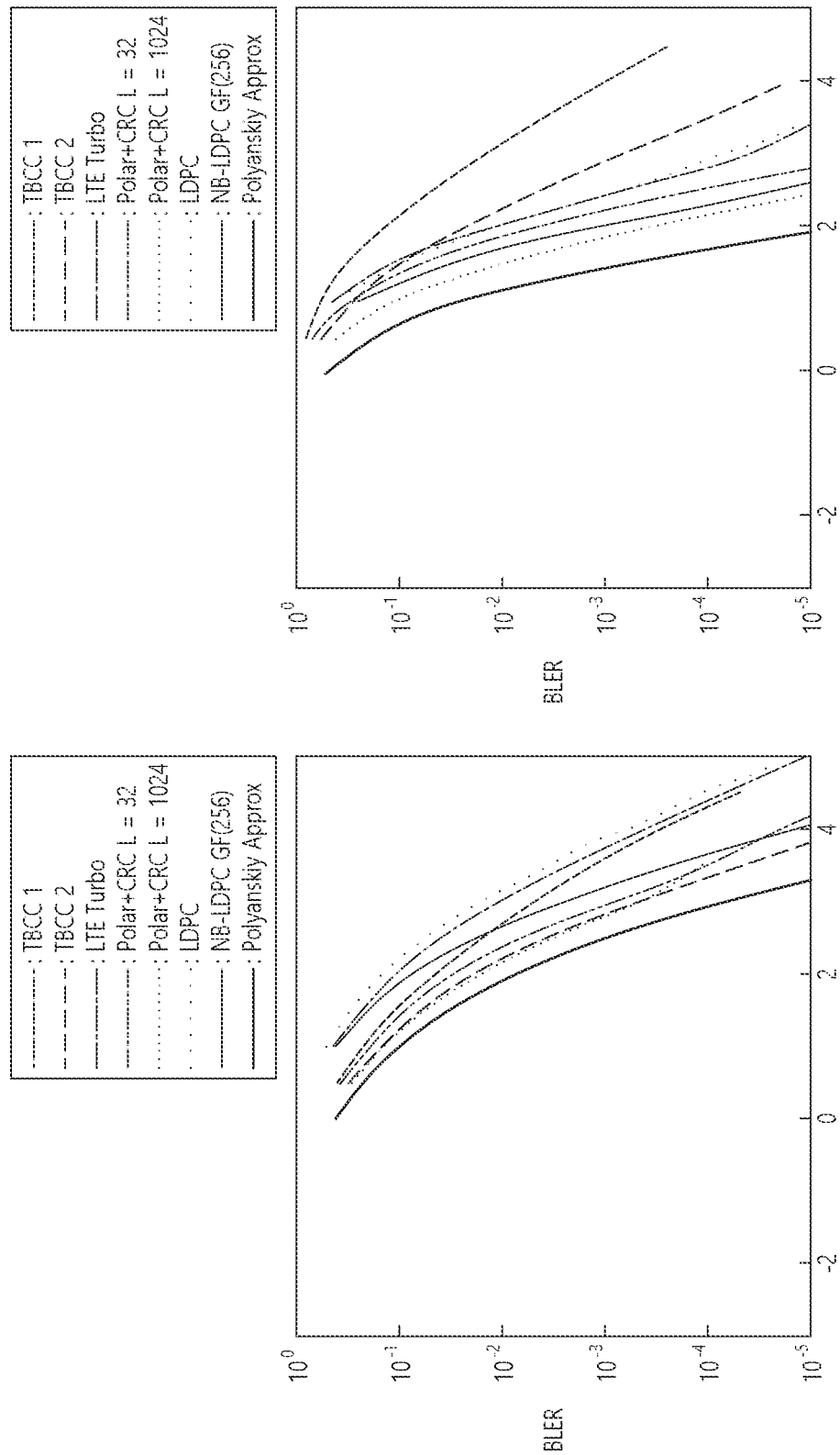
FIG. 7 is a diagram showing comparison between waterfall performances of other codes for channel coding and an NB-LDPC code.

FIG. 7 is a diagram showing a comparison between waterfall performances of other codes for channel coding and the NB-LDPC code.

Referring to FIG. 7, it can be ascertained that the NB-LDPC code has better performance than a polar code as well as a B-LDPC code in a general short-length regime, except for cases where a codeword has an extremely short length.

Consequently, it can be understood that the most important points in designing a protograph for a rate-compatible NB-LDPC code are how to maintain AVND in response to a code rate and how to overcome an error floor.

It can be ascertained that a protograph that satisfies $d_v^*=2$ has an improved minimum distance characteristic as compared to the conventional B-LDPC code (even if the protograph does not satisfy the LMDG characteristic) when nonbinary characteristics are grafted onto the protograph based on numerical simulation results based on the above mathematical analysis of FIG. 6.

Furthermore, referring to FIG. 7, since the protograph that satisfies $d_v^*=2$ has a steeper BLER curve slope than a case where the B-LDPC code is applied, and thus it can be ascertained that the protograph is more robust to an error floor than the B-LDPC code.

A kernel part of a rate-compatible structure proposed in the present disclosure may be designed in accordance with a middle rate (R=½), and based on this, it may be extended to a protograph having a higher rate and a protograph having a lower rate.

Figure 8:
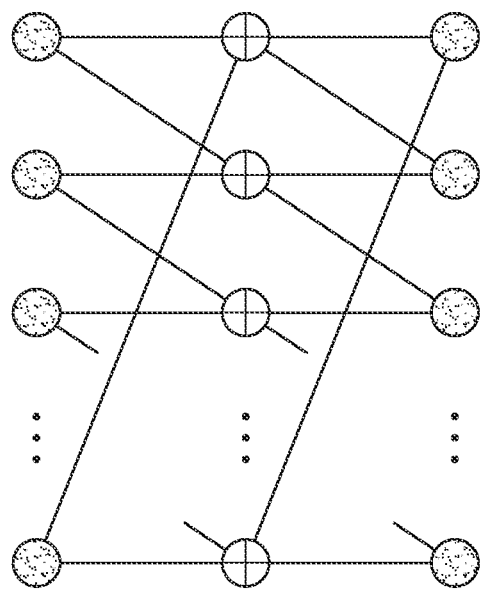
FIG. 8 is a diagram showing a structure of a protograph associated with a kernel part according to an embodiment of the present disclosure.

FIG. 8 is a diagram illustrating a structure of a protograph associated with a kernel part according to an exemplary embodiment.

Referring to FIG. 8, degrees of all variable nodes VNs included in the protograph associated with the kernel part according to the present embodiment may be set such that they satisfy 2. That is, the protograph associated with the kernel part according to the present embodiment may be designed to satisfy $d_v^*=2$.

Figure 9:
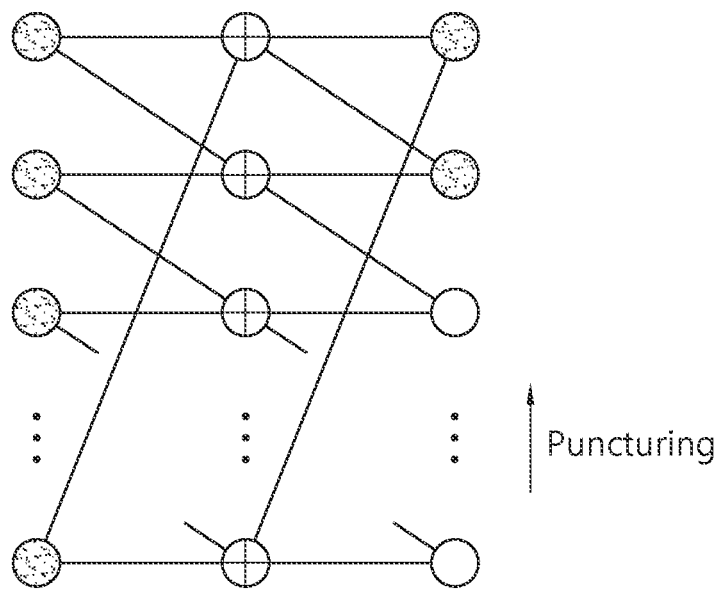
FIG. 9 is a diagram showing an operation for extension to a protograph having a high rate based on a protograph associated with a kernel part according to an embodiment of the present disclosure.

FIG. 9 is a diagram showing an operation for extension to a protograph having a high rate based on a protograph associated with the kernel part according to an embodiment of the present disclosure.

For example, the high rate mentioned in FIG. 9 may mean a case where R>½.

Referring to FIG. 1 to FIG. 9, for extension to a high-rate protograph, a puncturing operation may be performed based on a protograph associated with the kernel part of FIG. 8.

For example, when the puncturing operation of FIG. 9 is performed on the protograph associated with the kernel part, degree distribution of the punctured protograph may remain ($d_v^*=2$) the same as that of the kernel part.

For example, when nonbinary characteristics are applied to the punctured protograph, the punctured protograph may maintain a comparable decoding threshold according to the present embodiment. That is, the punctured protograph can guarantee high BLER performance.

For reference, the code rate of the kernel part does not necessarily have to satisfy R=½, and a protograph having a higher code rate (R=α(>0.5)) may be used as the kernel part. However, the comparable decoding threshold can be guaranteed only when a protograph having a higher code rate (R=α(>0.5)) conforms to $d_v^*=2$.

Hereinafter, an operation for extension to a protograph having a low rate based on a protograph associated with the kernel part will be described with reference to FIG. 10 and FIG. 11.

In this case, the operation for extension to a protocol with a low rate may be understood as adding VNs, CNs, and edges. (For example, when a code rate is lowered, rows and columns are added and 1 may be placed at the positions of the added rows and columns in terms of PCM).

In this case, the number of edges required when one VN is added is at least 2. However, when the number of edges is 2, it is a simple repetition code and only power gain can be obtained.

When the number of edges is 3 or more, $d_v^*$ becomes gradually far away from 2, and thus there is a loss in the decoding threshold in terms of performance.

Accordingly, for extension to a protograph having a low rate based on the NB-LDPC code, a tradeoff between an application gain of nonbinary characteristics and an incremental redundancy gain needs to be considered.

Figure 10:
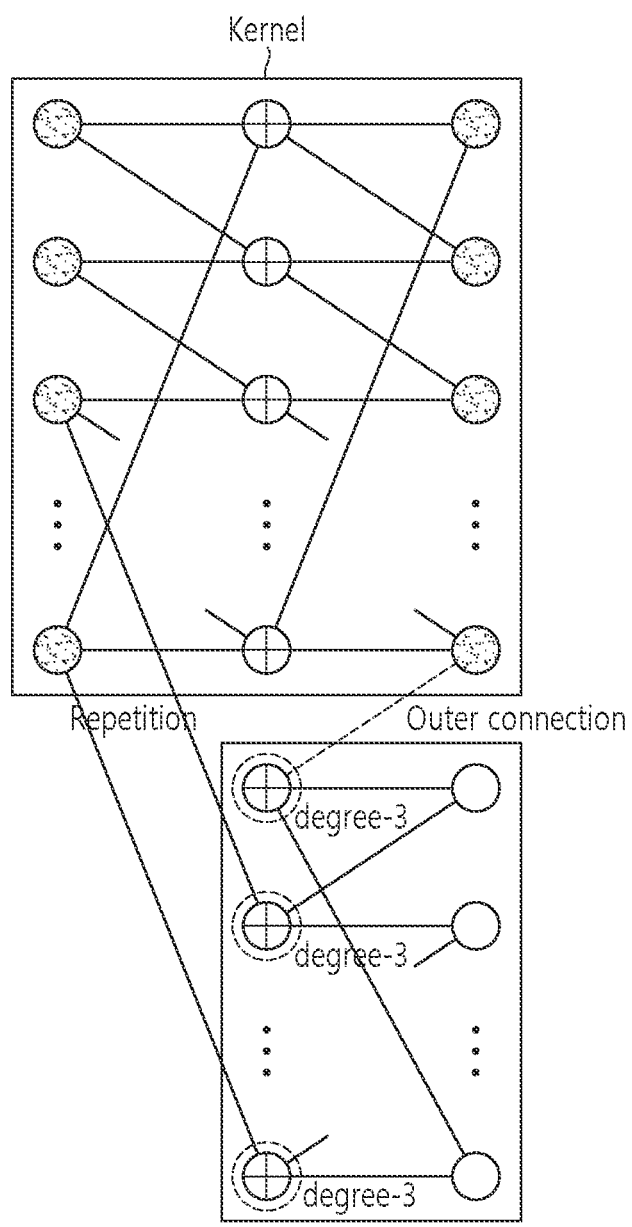
FIG. 10 is a diagram showing an operation for extension to a protograph having a low rate based on a protograph associated with a kernel part according to an embodiment of the present disclosure.

FIG. 10 is a diagram showing an operation for extension to a protograph having a low rate based on a protograph associated with the kernel part according to the present embodiment. FIG. 10 may be understood as an extension method focusing on the LDMG characteristics described above.

Even if the nonbinary characteristics are applied and thus the NB-LDPC code of the kernel part becomes robust to the error floor, there is no guarantee that ultra-reliability can be supported without an error flow in super URLLC because the structure of the kernel part does not satisfy the LMDG characteristics.

According to the present embodiment, a repeat accumulate check accumulate code (RACA) structure may be utilized. The RACA structure refers to a structure in which a parity of a former accumulated code is recursively used while multiple accumulate codes (e.g., degree-2 close loop structure) are concatenated to an inner code part.

Referring to FIG. 10, outer connection may be used to recursively utilize a parity of a former accumulate code.

In this case, in order to prevent $d_v^*$ from becoming far away from 2', minimum repetition and outer connection may be applied when accumulated codes are concatenated.

According to the present embodiment, newly added check nodes CN and variable nodes VN may be connected based on the degree of 2 because it is an accumulated code. In addition, in order to maintain $d_v^*$ close to 2, the number of edges between VNs belonging to the existing kernel part and newly added CNs may be minimized.

When minimum repetition and outer connection are applied to lower the code rate according to the present embodiment, a degree of newly added check nodes CN in FIG. 10 satisfies 3.

Referring to FIG. 10, since newly added variable nodes (VNs) and check nodes (CNs) are connected in a zigzag close loop form at degree-2, the newly added CNs have single edge connection with some of previous VNs.

Figure 11:
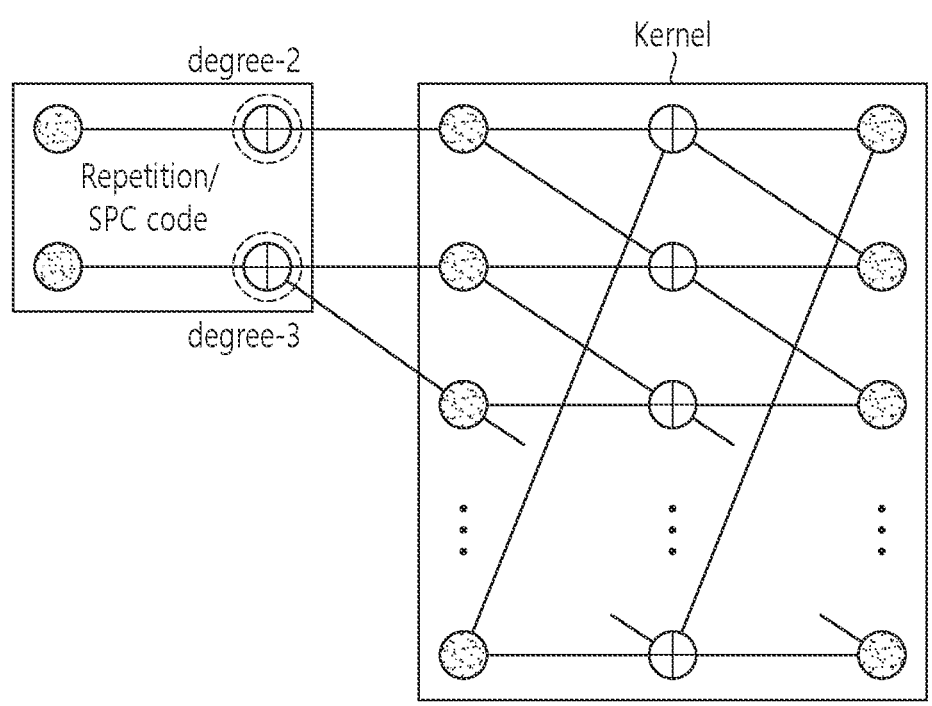
FIG. 11 is a diagram showing an operation for extension to a protograph having a low rate based on a protograph associated with a kernel part according to another embodiment of the present disclosure.

FIG. 11 is a diagram showing an operation for extension to a protograph having a low rate based on a protograph associated with a kernel part according to another embodiment of the present disclosure. FIG. 11 may be understood as an extension method focusing on the above-described iterative decoding threshold characteristic.

The embodiment of FIG. 11 is a method that considers both maintenance of $d_v^*$ and the incremental redundancy gain and may use a method of concatenating a repetition code and a single parity check code (hereinafter "'SPC").

As described above, the repetition code can obtain a power gain while helping to maintain NB-LDPC code series.

Referring to FIG. 11, a check node CN associated with a repetition code according to another embodiment may satisfy degree 2, and a check node CN associated with an SPC code may satisfy degree 3.

For example, when a repetition code is applied to a newly added check node CN, a single edge may be added between the newly added CN and a newly added VN, and a single edge may also be added between the newly added CN and an already existing VN.

In addition, when SPC is applied to a newly added check node CN, a single edge may be added between the newly added CN and a newly added VN, and a double edge may be added between the newly added CN and existing VNs.

Figure 12:
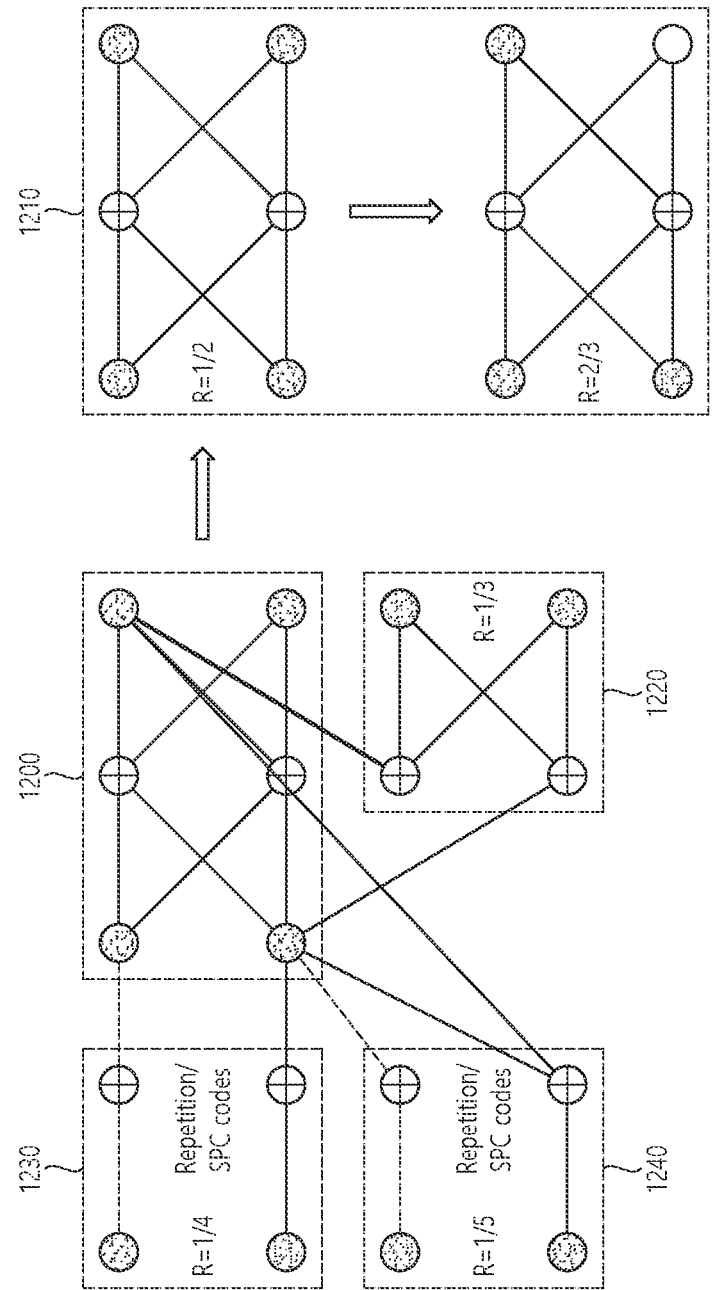
FIG. 12 is a diagram showing an exemplary protograph for a rate-compatible LDPC code according to an embodiment of the present disclosure.

FIG. 12 is a diagram showing an exemplary protograph for a rate-compatible LDPC code according to the present embodiment.

Referring to FIG. 1 to FIG. 12, a protograph 1200 associated with the kernel part of FIG. 12 may be designed to have R=½ and $d_v^*=2$.

For example, in order to support a high rate, a puncturing operation 1210 may be performed on the protograph 1200 associated with the kernel part. In this case, when the puncturing operation 1210 is performed, the protograph 1200 may have a rate of R=⅔ while maintaining $d_v^*=2$.

For example, in order to support a low rate, a part 1220 that uses minimum repetition and outer connection associated with FIG. 10 may be added to the protograph 1200 associated with the kernel part. In this case, the code rate of the protograph 1200 is R=⅓.

For example, the method of concatenating the repetition code and the SPC code of FIG. 11 may be performed on the protograph 1200 associated with the kernel part to which the part 1220 using minimum repetition and outer connection is added.

For example, when a part 1230 associated with the repetition code and the SPC code of FIG. 11 is concatenated once, the code rate of the protograph 1200 becomes R=¼.

In addition, when the part 1230 associated with the repetition code and the SPC code of FIG. 11 is cumulatively concatenated once more, the code rate of the protograph 1200 becomes R=⅕.

Figure 13:
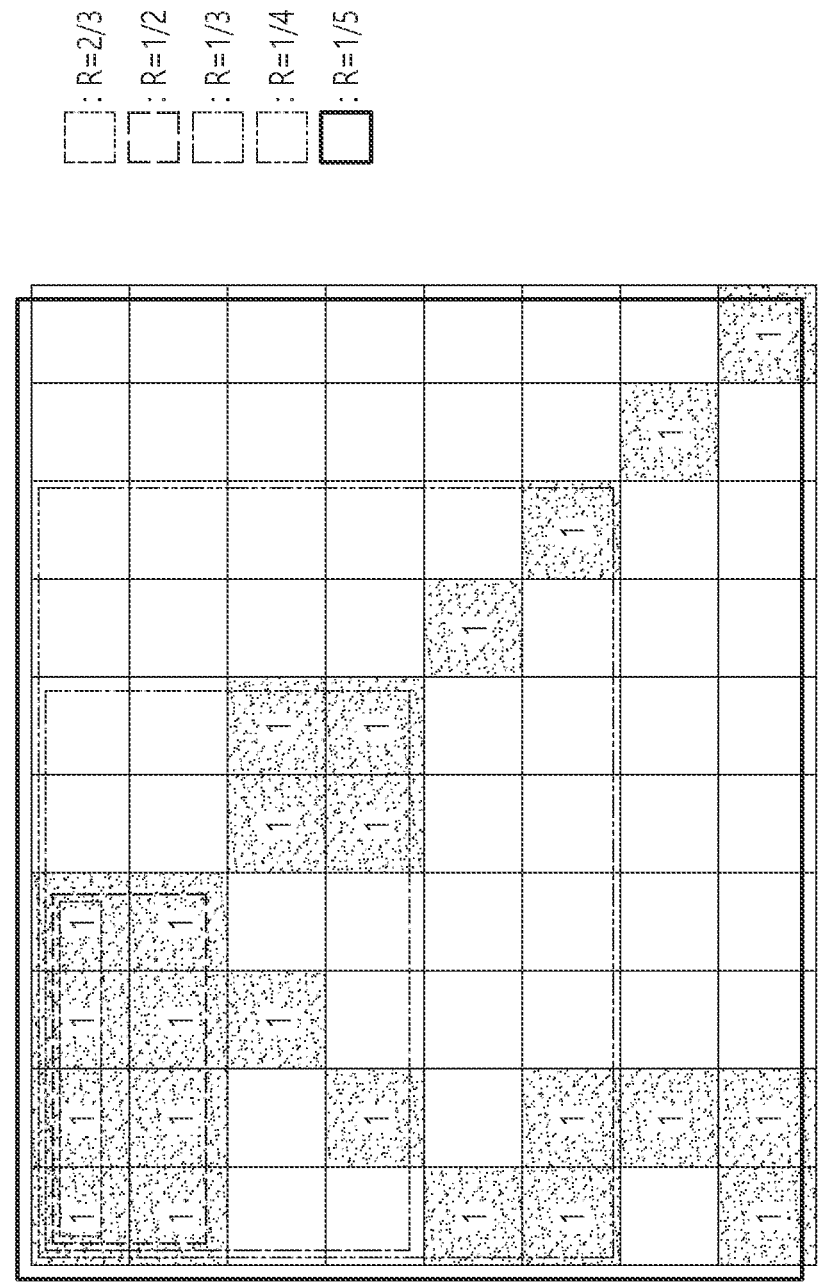
FIG. 13 is a diagram showing a binary matrix associated with an exemplary protograph for a rate-compatible LDPC code according to an embodiment of the present disclosure.

FIG. 13 is a diagram showing a binary matrix associated with an exemplary protograph for a rate-compatible LDPC code according to the present embodiment.

Referring to FIG. 12 and FIG. 13, the binary matrix having a code rate R of FIG. 13 may be associated with a protograph having a corresponding code rate in FIG. 12.

Figure 14:
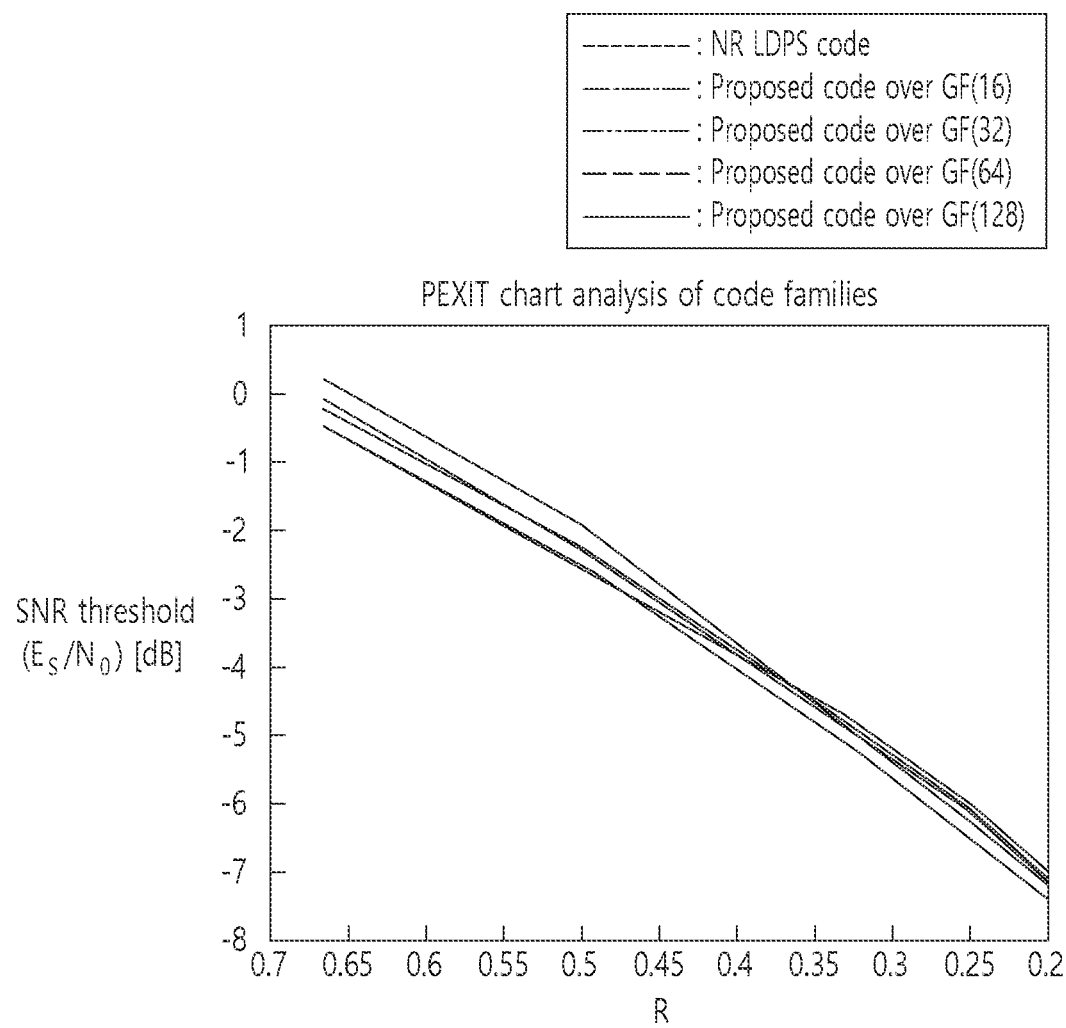
FIG. 14 is a diagram showing results of simulations for comparing the performance of the rate-compatible LDPC code according to an embodiment of the present disclosure with that of another code.

FIG. 14 is a diagram showing results of simulations for comparing the performance of the rate-compatible LDPC code according to the present embodiment with that of another code.

Referring to FIG. 14, iterative decoding threshold performance of a basegraph associated with an NR LDPC code is illustrated.

It can be ascertained that the exemplary protograph becomes slightly better than an NR LDPC code as q in FIG. 14 increases. In addition, it can be ascertained that the iterative decoding threshold performance slightly deteriorates as compared to that of the NR LDPC code due to a loss occurring in the process of obtaining LMDG characteristics in the case of a lower rate (e.g., R<½).

However, considering the characteristic that the NB-LDPC code has a much steeper BLER curve than the B-LDPC code, the corresponding loss in the high reliability region is not a significant problem.

Figure 15:
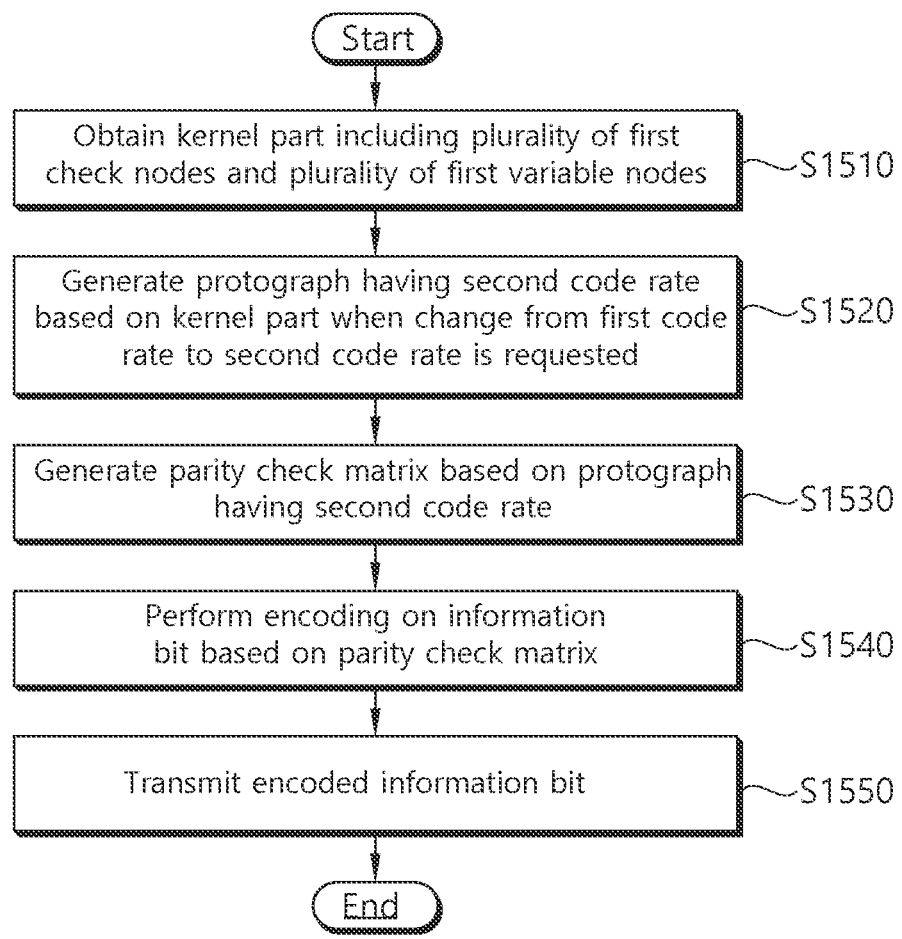
FIG. 15 is a flowchart showing a method for supporting a rate-compatible non-binary LDPC code.

FIG. 15 is a flowchart showing a method for supporting a rate-compatible non-binary LDPC code.

Referring to FIG. 1 to FIG. 15, a wireless device may obtain a kernel part including a plurality of first check nodes and a plurality of first variable nodes in step S1510.

For example, the kernel part may be obtained from information previously stored in the wireless device. Further, a predetermined first code rate may be applied to the kernel part. As an example, the first code rate may be ½. Further, the degree of each of the plurality of first variable nodes included in the kernel part may be set to 2.

When change from the first code rate to a second code rate is requested, the wireless device may generate a protograph having the second code rate based on the kernel part in step S1520.

For example, when the second code rate is greater than the first code rate, the wireless device may perform a puncturing operation on the plurality of variable nodes included in the kernel part. Here, the puncturing operation may be understood based on the above description with reference to FIG. 9.

As another example, when the second code rate is lower than the first code rate, the wireless device may concatenate an accumulate code to the kernel part. For example, the accumulate code may be associated with a plurality of second check nodes and a plurality of second variable nodes. Further, the degree of the plurality of second check nodes may be set to 3. Here, the operation of concatenating the accumulate code may be understood based on the above description with reference to FIG. 10.

As another example, when the second code rate is lower than the first code rate, the wireless device may concatenate at least one third check node and at least one third variable node to the kernel part. Here, the operation of concatenating the at least one third check node and the at least one third variable node may be understood based on the above description with reference to FIG. 11.

For example, when the at least one third check node is associated with a repetition code, the degree of the at least one third check node may be set to 2. In addition, when the at least one third check node is associated with a single parity check code, the degree of the at least one third check node may be set to 3.

The wireless device may generate a parity check matrix H based on the protograph having the second code rate in step S1530.

The wireless device may perform encoding on an information bit based on the generated parity check matrix H in step S1540.

The wireless device may transmit the encoded information bit to a counterpart device in step S1550.

Although specific embodiments have been described in the detailed description of the present disclosure, various modifications may be made without departing from the scope of the present disclosure. Therefore, the scope of the present disclosure should not be limited to the above-described embodiments and should be defined by the claims described below and equivalents thereto.

What is claimed is:

1. A method for supporting a rate-compatible nonbinary low density parity check (LDPC) code, by a wireless terminal, comprising:

obtaining a kernel part including a plurality of first check nodes and a plurality of first variable nodes, wherein a predetermined first code rate is applied to the kernel part, and a degree of each of the plurality of first variable nodes included in the kernel part is set to 2;

generating a protograph having a second code rate based on the kernel part when the first code rate is changed to the second code rate;

generating a parity check matrix H based on the protograph having the second code rate;

performing encoding on an information bit based on the generated parity check matrix H; and transmitting the encoded information bit to a counterpart device.

2. The method of claim 1, wherein the generating of the protograph having the second code rate based on the kernel part comprises performing a puncturing operation on the plurality of variable nodes included in the kernel part when the second code rate is greater than the first code rate.

3. The method of claim 1, wherein the generating of the protograph having the second code rate based on the kernel part comprises concatenating an accumulate code to the kernel part when the second code rate is lower than the first code rate, wherein the accumulate code is associated with a plurality of second check nodes and a plurality of second variable nodes, and a degree of the plurality of second check nodes is set to 3.

4. The method of claim 1, wherein the generating of the protograph having the second code rate based on the kernel part comprises concatenating at least one third check node and at least one third variable node to the kernel part when the second code rate is lower than the first code rate, wherein a degree of the at least one third check node is set to 2 when the at least one third check node is associated with a repetition code, and wherein a degree of the at least one third check node is set to 3 when the at least one third check node is associated with a single parity check code.

5. The method of claim 1, wherein the first code rate is ½.

6. A wireless terminal supporting a rate-compatible non-binary LDPC code, comprising:

a transceiver configured to transmit and receive radio signals; and a processor operating in combination with the transceiver, wherein the processor is configured to:

obtain a kernel part including a plurality of first check nodes and a plurality of first variable nodes, wherein a predetermined first code rate is applied to the kernel part, and a degree of each of the plurality of first variable nodes included in the kernel part is set to 2, generate a protograph having a second code rate based on the kernel part when the first code rate is changed to the second code rate, generate a parity check matrix H based on the protograph having the second code rate, perform encoding on an information bit based on the generated parity check matrix H, and transmit the encoded information bit to a counterpart device.

7. The wireless terminal of claim 6, wherein the processor is further configured to perform a puncturing operation on the plurality of variable nodes included in the kernel part when the second code rate is greater than the first code rate.

8. The wireless terminal of claim 6, wherein the processor is further configured to concatenate an accumulate code to the kernel part when the second code rate is lower than the first code rate, wherein the accumulate code is associated with a plurality of second check nodes and a plurality of second variable nodes, and a degree of the plurality of second check nodes is set to 3.

9. The wireless terminal of claim 6, wherein the processor is further configured to concatenate at least one third check node and at least one third variable node to the kernel part when the second code rate is lower than the first code rate, wherein a degree of the at least one third check node is set to 2 when the at least one third check node is associated with a repetition code, and wherein a degree of the at least one third check node is set to 3 when the at least one third check node is associated with a single parity check code.

10. The wireless terminal of claim 6, wherein the first code rate is ½.

* * * * *